Aug. 7, 1956 D. J. HAMILTON 2,758,206

TRANSISTOR PULSE GENERATOR

Filed Aug. 3, 1955 2 Sheets-Sheet 1

DOUGLAS J. HAMILTON,
INVENTOR

BY Henry Heyman
ATTORNEY

Aug. 7, 1956 D. J. HAMILTON 2,758,206

TRANSISTOR PULSE GENERATOR

Filed Aug. 3, 1955 2 Sheets-Sheet 2

DOUGLAS J. HAMILTON,
INVENTOR

BY Henry Heyman
ATTORNEY

United States Patent Office 2,758,206

Patented Aug. 7, 1956

2,758,206

TRANSISTOR PULSE GENERATOR

Douglas J. Hamilton, Los Angeles, Calif., assignor to Hughes Aircraft Company, Culver City, Calif., a corporation of Delaware Application August 3, 1955, Serial No. 526,209

9 Claims. (Cl. 250—36)

This invention relates generally to pulse generators and, more particularly, to a transistor pulse generator which produces output pulses at a preselected point or points of each period of an applied input signal.

It is often desirable to produce an output pulse or square wave which is stably timed, that is, occurs at the same preselected point of each period of a periodically recurring input wave such as for example a sine wave. One application of a circuit which would produce such results, for purposes of illustration only, is in a digital computer as a means for producing accurately timed clock pulses which may be used for reading, timing, and controlling the computer.

In the past, such a result has been accomplished generally in one of two ways—first, by amplifying the sine wave, clipping it to obtain a reasonably square wave, and then differentiating the resultant square wave to obtain an output pulse or pip of voltage at the leading and trailing edges of the square wave. However, this system is extremely sensitive to the input waveform amplitude and is therefore not too reliable.

The second method is to use the well-known multiar circuit which is described in detail in vol. 19, Radiation Laboratory Series, entitled "Waveforms," pages 343 through 345, published by the McGraw-Hill Book Company, 1949. Although the multiar circuit is more reliable than the first system mentioned above, it is a very inefficient means of accomplishing the desired result since the vacuum tube therein is conducting at all times except when an output pulse is being developed. Furthermore, the pulses are pips as distinguished from substantially square waves and would therefore have to be clipped in order to obtain the desired square wave.

Accordingly, an object of the present invention is to provide a transistor triggered pulse generator which produces output pulses having an amplitude and time of occurrence that are independent of the amplitude of the applied input signal.

Another object of the present invention is to provide a transistor pulse generator which produces output pulses as the applied input signal passes through its zero reference point.

A further object of the present invention is to provide a transistor pulse generator which produces an output pulse only at a pre-selected point of each period of the applied input signal.

A transistor pulse generator in accordance with the present invention comprises a point-contact type transistor including an emitter, a collector, and a base, and which is connected to operate essentially as a blocking oscillator. Connected to the base through coupling means is an input signal source which applies a periodically recurring control signal to the transistor. Connected in the base circuit of the transistor is means for controlling the time at which the transistor will conduct in response to the applied input signal. In the emitter circuit of the transistor is connected means which controls the recovery time of the emitter, thus determining the number of times the transistor will conduct during each period of the applied input signal.

The novel features of the present invention are set forth in particularity in the appended claims. Other and more specific objects of the present invention will become apparent from a consideration of the following description taken in connection with the accompanying drawings, in which:

Figure 1:
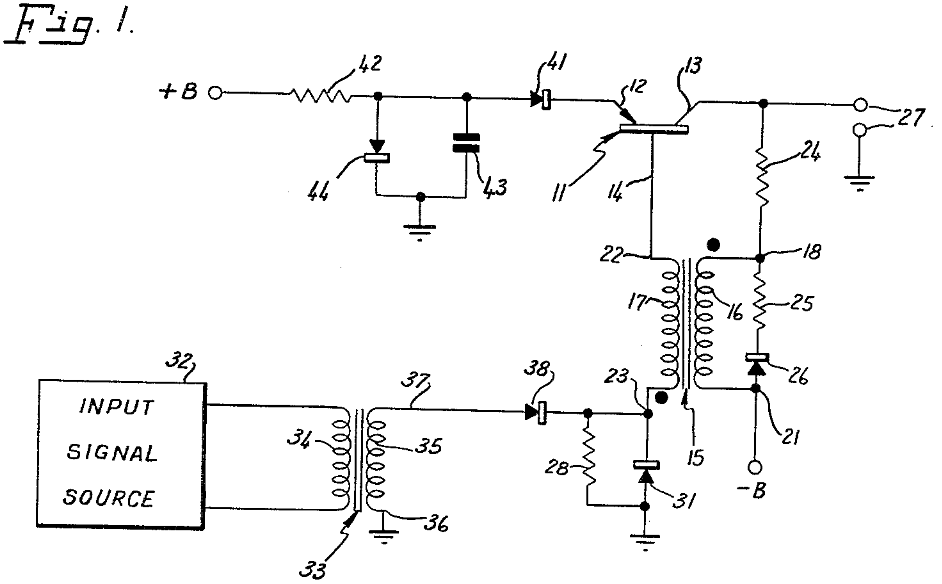
Fig. 1 is a schematic circuit diagram of the preferred embodiment of the transistor pulse generator of the present invention.

Referring now to the drawings in which like components are designated by the same reference character and, more particularly, to Fig. 1, there is shown a transistor 11 having an emitter 12, a collector 13, and a base 14. Transistor 11 may for example be a point-contact transistor having an N-type semiconductive body as indicated by the accepted schematic symbol used therefor. However, it is to be understood that a point-contact transistor having a P-type semiconductive body may be used by reversing the applied voltages hereinafter described. A pulse transformer 15 having a primary winding 16 and a secondary winding 17 is used as a regenerative feedback path between collector 13 and base 14 of transistor 11. Primary winding 16 has two terminals 18 and 21, while secondary winding 17 likewise has two terminals 22 and 23. Connected between collector 13 and terminal 18 is load resistor 24. Connected between terminals 18 and 21 of primary winding 16 are series connected resistor 25 and diode 26. Diode 26 is used to prevent negative overshoot of the output signal which appears across output terminals 27, one of which is grounded and the other of which is connected to collector 13. Terminal 21 of primary winding 16 is also connected to a source of operating potential —B which biases collector 13 in the usual manner, that is, in a non-conducting polarity with respect to base 14.

Terminal 22 of secondary winding 17 is connected to base 14 of transistor 11. Pulse transformer 15 is poled as indicated by the dots in such a manner to supply a positive-feedback signal to transistor 11 when conduction occurs. Connected between terminal 23 of secondary winding 17 and ground are parallel connected resistor 28 and diode 31. An input signal source which may for example provide a periodically recurring waveform, such as a sine wave, is represented by rectangle 32. Transformer 33 having a primary winding 34 and a secondary winding 35 is used as coupling means between signal source 32 and base 14 of transistor 11. Secondary winding 35 has two terminals 36 and 37, terminal 36 being grounded. Input signal source 32 is connected across primary winding 34 of transformer 33. Connected between terminal 37 of secondary winding 35 and terminal 23 of secondary winding 17 of pulse transformer 15 is diode 38 which is poled to pass positive-going signals. Diode 38 in conjunction with resistor 28 and diode 31 is used to control the point at which transistor 11 will conduct in response to signals applied from input signal source 32 through transformer 33.

Series connected diode 41 and resistor 42 are connected between emitter 12 and a source of operating potential +B which biases emitter 12 in the conventional manner, that is, in a conducting polarity with respect to base 14. Connected between the junction of diode 41 and resistor 42 and ground are parallel connected diode 44 and capacitor 43. The reverse bias impedance of diode 41 and emitter 12 and the resistance of resistor 42 control the discharge time of capacitor 43 which, in turn, determines the recovery time of emitter 12. The recovery time of emitter 12 determines how often during each period of the applied input signal transistor 11 will be able to conduct.

In discussing the operation of the circuit of Fig. 1 reference will be made to the first four waveforms of Fig. 3, wherein the abscissa represents time and the ordinate voltage, namely the input wave which is taken across primary 34 of transformer 33, the waveform $B_1$ which is taken by measuring between base 14 and ground, waveform $E_1$ which is taken by measuring between emitter 12 and ground, and output A which is taken by measuring across output terminals 27.

Figure 3:
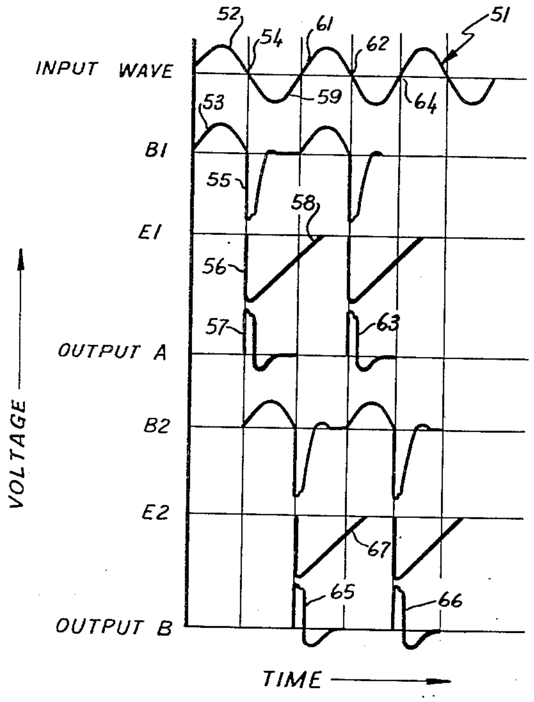
Fig. 3 is a graph illustrating voltage waveforms taken at various points throughout the circuits of Figs. 1 and 2.

Assume as a first example of operation of the circuit of Fig. 1 that transistor 11 is non-conductive and that input wave 51 is positive-going as shown at 52 on Fig. 3. Transformer 33 is poled in such a manner that the signal which is induced in secondary winding 35 is positive-going at terminal 37 thereof. This causes the anode of diode 38 to be positive with respect to its cathode and, thus, to be conducting. Current then flows through secondary winding 35, diode 38, and resistor 28 to ground, causing a voltage drop across resistor 28 which is positive with respect to ground. This voltage drop biases diode 31 so that it is non-conducting. The potential level on base 14 of transistor 11 therefore follows input wave 51 during the positive half cycle as shown at 53 on curve $B_1$ of Fig. 3. This is true since diode 44 is conducting due to the voltage of +B, causing its anode to be positive with respect to its cathode and therefore clamps emitter 12 essentially to ground potential. This, in turn, causes transistor 11 to remain non-conducting during the entire positive half cycle 52 of input wave 51.

Consider now the point where input wave 51 crosses its zero reference point as shown at 54 on Fig. 3. At this point the potential on the anode of diode 38 becomes equal to the potential on its cathode, thus causing diode 38 to become non-conducting. Base 14 of transistor 11 is therefore at essentially ground potential at this instant. Emitter 12 is slightly positive with respect to base 14 due to the small voltage drop across diode 44. This causes emitter current and, consequently, collector current to begin to flow. Current also flows from ground through base 14 and collector 13 which biases diode 31 in a forward or conducting direction.

Collector current beginning to flow causes current to flow through primary 16 of pulse transformer 15 which produces a positive-going potential at terminal 18. This induces a voltage in secondary winding 17 which is negative at terminal 22 as indicated by the polarity markings of transformer 15. This negative potential on base 14 is seen as a positive voltage by emitter 12, thus causing greater conduction through transistor 11. This greater conduction, in turn, causes a larger signal to be developed on base 14, resulting in still more current flowing through transistor 11. This regenerative process continues, resulting in a sharp drop in voltage on base 14 and emitter 12 as indicated at 55 on curve $B_1$ and 56 on curve $E_1$, respectively, of Fig. 3, until the collector of transistor 11 becomes saturated. Capacitor 43 appears to emitter 12 as essentially a short circuit to ground with respect to resistor 42 during this period of conduction. Therefore, substantially all of the emitter current flows through capacitor 43, charging it negative with respect to ground, thus causing diode 44 to become non-conducting.

Upon reaching the point where transformer 15 can no longer supply the positive feedback which is necessary to continue the regeneration, that is, blocking action of transistor 11, current flow through collector 13 will begin to decrease. The decrease in current flow causes a regenerative current cutoff through transistor 11 in the same manner as previously described for the regenerative conduction, but with reverse polarities. The blocking operation of transistor 11 results in a substantially square wave of voltage appearing across output terminals 27 as indicated at 57 on curve output A of Fig. 3.

Since transistor 11 is non-conducting and emitter current no longer flows at this point, capacitor 43 will begin to discharge toward the potential of +B. The rate at which capacitor 43 discharges is controlled by the reverse or back bias impedance of diode 41, the emitter-to-base impedance of transistor 11, and the resistance of resistor 42. The combination of these impedances must be chosen so that emitter 12 returns to ground potential after the occurrence of the negative-going portion 59 of curve 51. Therefore, it is seen that since the diode and transistor impedances are relatively fixed, the selection of resistor 42 is the controlling factor. If emitter 12 were allowed to return to ground potential during negative portion 59 of curve 51, transistor 11 would produce another output pulse at this point which is undesirable according to the preferred mode of operation. When emitter 12 reaches ground potential, as indicated at 58 on curve $E_1$ of Fig. 3, diode 44 once more becomes conducting, clamping emitter 12 essentially to ground.

It will be noted that curve 51 again passes through its zero reference point as indicated at 61 on Fig. 3, but transistor 11 is not allowed to conduct at this point due to the controlled discharge of capacitor 43. Therefore, it is seen that the circuit of Fig. 1 produces an output pulse only when curve 51 passes through its zero reference point and the slope thereof is negative.

If at a later time input wave 51 passes through its zero reference point again and the slope is negative as indicated at 62, transistor 11 will once more regeneratively produce an output pulse as shown at 63 on curve output A. The operation of the circuit will be identical to that above described.

It may be desirable in some applications to balance the load appearing across secondary 35 of coupling transformer 33. If this becomes necessary, a diode such as that shown at 38 and a resistor similar to that shown at 28 may be connected in series and between terminal 37 and ground with the diode being poled opposite to that of diode 38.

Figure 2:
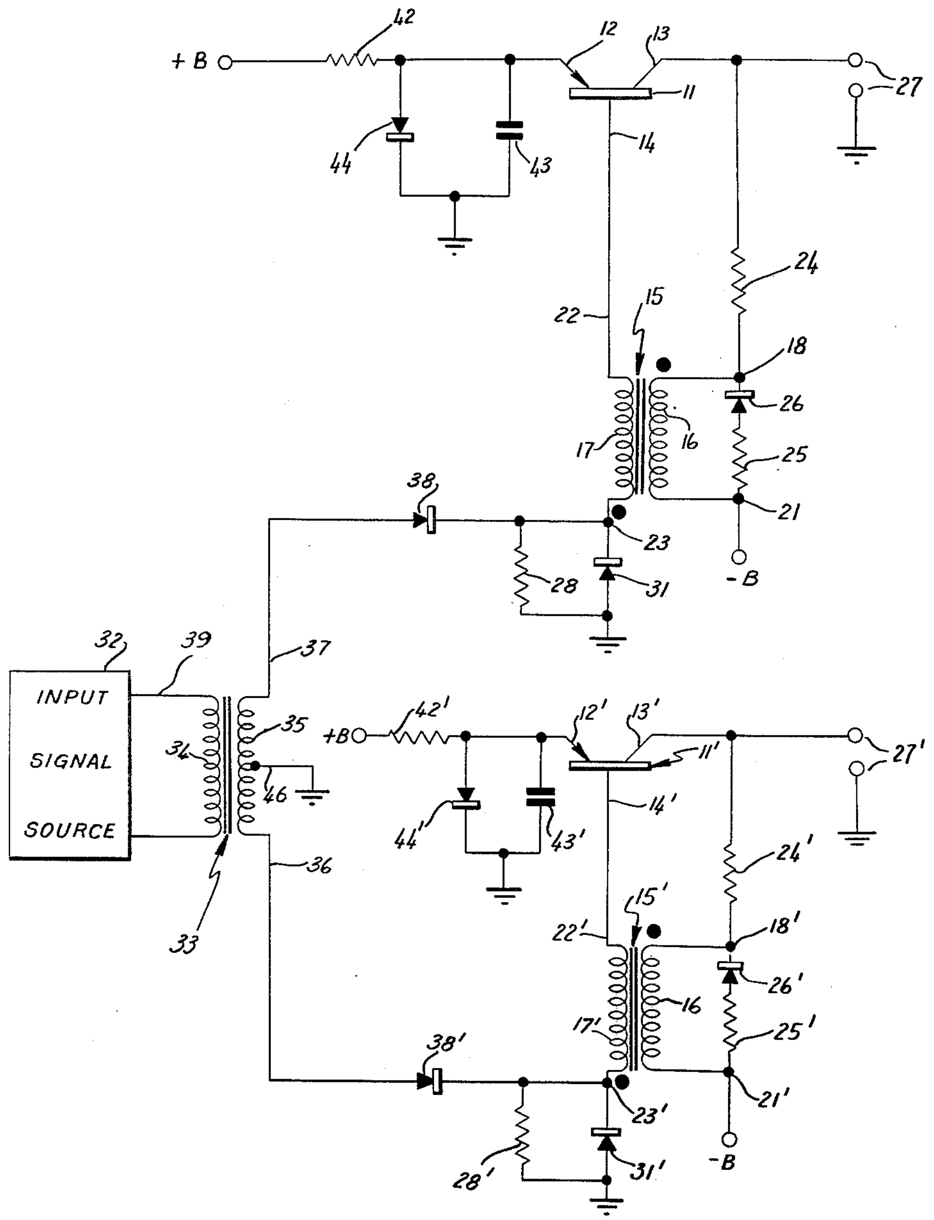
Fig. 2 is a schematic circuit diagram of a further embodiment utilizing the transistor pulse generator of the present invention.

Referring now more particularly to Fig. 2, there are shown two circuits connected across secondary winding 35 of transformer 33. Each of the circuits is identical with that of Fig. 1 as indicated by the same reference symbols being used with the following exceptions. Diode 41 is omitted from the emitter circuit and secondary winding 35 of transformer 33 has a center tap 46 which is connected to ground. The circuit components of that circuit which is connected to terminal 36 of secondary winding 35 are identified by primed reference numerals for purposes of clarity in the discussion of operation which follows.

A circuit such as that shown in Fig. 2 is useful primarily in a digital computer employing a Ferranti or Manchester system of reading. A Ferranti system is a non-return-to-zero system of recording in that current states, as distinguished from current pulses, are applied to the recording head, and a binary 1 or zero is always recorded with two current states of equal duration and opposite polarity during the binary bit interval. In such a system, it is necessary to have clock pulses appearing at each binary interval and at the midpoint between these intervals to obtain proper operation.

The operation of each half of the circuit shown in Fig. 2 is identical to that described for the circuit of Fig. 1 in that transistors 11 and 11′ regeneratively produce output signals which are substantially square waves across output terminals 27 and 27′, respectively. However, transistor 11′ conducts only when the input wave 51 is crossing its zero reference point and its slope is positive as indicated at 61 and 64 on Fig. 3. This results in output waves as shown at 65 and 66 in output curve B of Fig. 3. The waveforms appearing on base 14′ and emitter 12′ are as shown on curves $B_2$ and $E_2$ of Fig. 3. As indicated by curve $B_2$, transformer 33 is poled so that the input wave appearing at terminal 36 of secondary 35 is positive-going when the input wave from input signal source 32 appearing at terminal 39 of primary 34 is negative-going.

Once the regenerative cycle of transistor 11′ is completed, emitter 12′ is maintained non-conductive during the remainder of that half cycle of the input wave 51, as hereinabove explained for the circuit of Fig. 1 and as shown at 67 on curve $E_2$ of Fig. 3.

It should be understood that the circuit specifications for the transistor pulse generator may vary according to the design for any particular application. The following circuit specifications for the circuit of Fig. 1 are included by way of example only and are suitable for operation with an input wave having a frequency of from zero to 300 kilocycles, per second.

| | |
|---|---|
| Transistor **11** | Transistor Products point contact transistor type TPC–2G. |
| Resistors **24, 25** | 330 ohms. |
| Resistor **28** | 5,100 ohms. |
| Resistor **42** | 120,000 ohms. |
| Capacitor **43** | 160 micro-microfarads. |
| Diodes **26, 31, 38, 41, 44** | Hughes Aircraft Company Type 1N100. |
| Transformer **33** | 1:1 turns ratio wound on a Ferramic F–261 H core. |
| Transformer **15** | Pacific Coast Associates Type 101–1. |

There have thus been disclosed two embodiments of a transistor pulse generator which produce substantially square output waves which are independent of the amplitude of the applied input signal and which occur only in response to the input signal crossing its zero reference point.

What is claimed is:

1. A transistor pulse generator for producing output pulses upon occurrence of the zero reference cross-over point of an applied input signal comprising: a point-contact type transistor including an emitter, a collector, and a base; a source of input signals; a source of operating potential connected to said transistor; feedback means interconnecting said collector and said base to provide an external feedback path to cause regeneration; conductive control means connected between said base and said input signal source, whereby said transistor is allowed to conduct only in response to the applied input signal passing through its zero reference point; and recovery control means connected between said emitter and said source of operating potential, whereby said transistor is allowed to conduct only once during each period of the applied input signal.

2. A transistor pulse generator for producing output pulses upon occurrence of a preselected reference point of an applied input signal comprising: a point-contact type transistor including an emitter, a collector, and a base; a source of input signals; a source of operating potential connected to said transistor; feedback means including a pulse transformer interconnecting said collector and said base for producing an output pulse and to provide an external feedback path to cause regeneration; conductive control means connected between said base and said input signal source, whereby said transistor is allowed to conduct in response to the applied input signal passing through its preselected reference point; and recovery control means connected between said emitter and said source of operating potential, whereby said transistor is allowed to conduct only once during each period of the applied input signal.

3. A transistor pulse generator for producing output pulses upon occurrence of the zero reference cross-over point of an applied input signal comprising: a point-contact type transistor having an N-type semiconductive body and including an emitter, a collector, and a base; a source of input signals; a source of operating potential including a positive and negative terminal connected to said transistor; feedback means including a pulse transformer poled to apply a negative-going pulse to said base and interconnecting said collector and said base to provide an external feedback path to cause regeneration and to produce an output pulse; conductive control means connected between said base and said input signal source, whereby said transistor is allowed to conduct only in response to the applied input signal passing through its zero reference point; and recovery control means connected between said emitter and said positive terminal of said source of operating potential, whereby said transistor is allowed to conduct only once during each period of the applied input signal.

4. A transistor pulse generator for producing an output pulse as an applied input signal passes through a preselected reference point comprising: a point-contact type transistor including an emitter, a collector and a base; an input signal source; a source of operating potential connected to said transistor; feedback means interconnecting said collector and said base to provide external feedback to cause regeneration; first rectifying means connected to said base; coupling means interconnected between said first rectifying means and said input signal source for applying input signals to said transistor; a first impedance element and second rectifying means connected in parallel and between said base and a common terminal point, whereby said transistor is allowed to conduct only at a preselected point of each period of the applied input signal; a second impedance element connected between said emitter and said source of operating potential; and charge storage means and third rectifying means connected in parallel and between said emitter and said common point, whereby said transistor is allowed to conduct only once during each period of the applied input signal.

5. A transistor pulse generator for producing an output pulse as an applied input signal passes a preselected reference point comprising: a point-contact type transistor including an emitter, a collector and a base; a periodically recurring input signal source; a source of operating potential connected to said transistor; feedback means interconnecting said collector and said base to provide external feedback to cause regeneration; a first diode connected to said base; coupling means interconnecting said first diode and said input signal source for applying the input signals to said transistor; a first impedance element and second diode connected in parallel and between said base and a common terminal point, whereby said transistor is allowed to conduct only at a preselected point of each period of the applied input signal; a second impedance element connected between said emitter and said source of operating potential; and charge storage means and a third diode connected in parallel and between said emitter and said common point, whereby said transistor is allowed to conduct only once during each period of the applied input signal.

6. A transistor pulse generator for producing an output pulse as an applied input signal passes a preselected reference point comprising: a point-contact type transistor including an emitter, a collector and a base; a periodically-recurring input signal source; a source of operating potential connected to said transistor; feedback means interconnecting said collector and said base to provide external feedback to cause regeneration; a first diode connected to said base and pole to pass positive-going signals; a transformer interconnecting said first diode and said input signal source for applying the input signals to said transistor; a first resistive impedance element and a second diode poled to pass negative-going signals connected in parallel and between said base and a common terminal point, whereby said transistor is allowed to conduct only at a pre-selected point of each period of the applied input signal; a second resistive impedance element connected between said emitter and said source of operating potential; and a capacitor and third diode connected in parallel and between said emitter and said common point, whereby said transistor is allowed to conduct only once during each period of the applied input signal.

7. The transistor pulse generator described in claim 6 wherein said diodes are crystal diodes and said resistive impedance elements are resistors.

8. A controlled transistor blocking oscillator for producing an output pulse as an applied input signal passes a preselected reference point comprising: a point-contact type transistor having an N-type semiconductive body and including an emitter, a collector, and a base; a periodically recurring input signal source; a source of operating potential including a positive and a negative terminal; feedback means including a pulse transformer interconnecting said collector and said base to provide external feedback to cause regeneration, and poled to apply a negative-going signal to said base; a first diode connected to said base; a transformer including primary and secondary windings, said primary winding being connected to said input signal source, said secondary winding being connected between said first diode and a common terminal point; a first resistor and second diode connected in parallel and between said base and said common point, whereby said transistor is allowed to conduct only at a preselected point of the applied input signal; a second resistor connected between said emitter and said source of operating potential; and a capacitor and third diode connected in parallel and between said emitter and said common point, whereby said transistor is allowed to conduct only once during each period of the applied input signal.

9. A controlled transistor blocking oscillator for producing an output pulse as an applied input signal passes through a preselected reference point, comprising: a point-contact type transistor including an emitter, a collector, and a base; a periodically recurring input signal source; a source of operating potential including a positive and negative terminal; feedback means including a transformer interconnecting said collector and said base to provide an external feedback path to cause regeneration; a first diode connected to said base; a transformer including primary and secondary windings, said primary winding being connected to said input signal source, said secondary winding being connected between said first diode and a common terminal point; a first resistor and second diode connected in parallel and between said base and said common point, whereby said transistor is allowed to conduct only at a pre-selected point of the applied input signal; a third diode connected to said emitter; a second resistor connected between said third diode and said source of operating potential; and a capacitor and third diode connected in parallel and between said emitter and said common point, whereby said transistor is allowed to conduct only once during each period of the applied input signal.

No references cited.